(12) United States Patent
Zhou

(10) Patent No.: US 10,121,872 B2
(45) Date of Patent: Nov. 6, 2018

(54) METHOD FOR FORMING A SEMICONDUCTOR DEVICE COMPRISING A SELECTIVELY GROWN GRAPHENE LAYER

(71) Applicants: Semiconductor Manufacturing International (Beijing) Corporation, Beijing (CN); Semiconductor Manufacturing International (Shanghai) Corporation, Shanghai (CN)

(72) Inventor: Ming Zhou, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/683,106

(22) Filed: Aug. 22, 2017

(65) Prior Publication Data

US 2018/0097082 A1   Apr. 5, 2018

(30) Foreign Application Priority Data

Sep. 30, 2016   (CN) .......................... 2016 1 0868166

(51) Int. Cl.
    *H01L 29/66*   (2006.01)
    *H01L 29/16*   (2006.01)
    (Continued)

(52) U.S. Cl.
    CPC .... *H01L 29/66045* (2013.01); *H01L 21/0262* (2013.01); *H01L 21/02488* (2013.01);
    (Continued)

(58) Field of Classification Search
    CPC ......... H01L 29/66045; H01L 29/66742; H01L 29/78684; H01L 29/78648;
    (Continued)

(56) References Cited

U.S. PATENT DOCUMENTS

| 2010/0200839 A1 | 8/2010 | Okai et al. |
| 2012/0175594 A1 | 7/2012 | Chen et al. |

(Continued)

OTHER PUBLICATIONS

European Search Report for corresponding European Application No. 17188981.9 dated Feb. 7, 2018.

*Primary Examiner* — Robert Huber
*Assistant Examiner* — Gardner W Swan
(74) *Attorney, Agent, or Firm* — Brinks Gilson & Lione

(57) ABSTRACT

The present disclosure relates to the technical field of semiconductor processes and discloses a semiconductor device and a manufacturing method therefor. The method includes: providing a substrate containing a first dielectric layer; forming a lower gate material layer on the first dielectric layer; patterning the lower gate material layer to form gate lines; depositing a second dielectric layer to cover the gate lines; planarizing the second dielectric layer; forming an insulating buffer material layer; patterning the insulating buffer material layer to form a patterned insulating buffer layer containing multiple separate portions, each separate portion extending to intersect one or more gate lines; selectively growing a graphene layer on the patterned insulating buffer layer; forming a third dielectric layer to cover the graphene layer and the second dielectric layer; and forming an upper gate electrode layer on the third dielectric layer. In the present disclosure, a patterned graphene layer may be obtained by means of the selective growth of graphene, thereby avoiding undesired effects from patterning the graphene. In addition, the semiconductor device of (Continued)

the present disclosure may use a dual-gate structure that can offer better current control.

12 Claims, 11 Drawing Sheets

(51) Int. Cl.
*H01L 29/49* (2006.01)
*H01L 29/786* (2006.01)
*H01L 21/02* (2006.01)

(52) U.S. Cl.
CPC .... *H01L 21/02527* (2013.01); *H01L 29/1606* (2013.01); *H01L 29/4908* (2013.01); *H01L 29/66742* (2013.01); *H01L 29/78603* (2013.01); *H01L 29/78648* (2013.01); *H01L 29/78684* (2013.01)

(58) Field of Classification Search
CPC ........... H01L 29/78603; H01L 29/4908; H01L 29/1606; H01L 21/0262; H01L 21/02488; H01L 21/02527
See application file for complete search history.

(56) References Cited

U.S. PATENT DOCUMENTS

| | | | |
|---|---|---|---|
| 2012/0199815 A1* | 8/2012 | Kondo | H01L 21/02381 257/29 |
| 2012/0241069 A1* | 9/2012 | Hofmann | B82Y 30/00 156/60 |
| 2018/0040700 A1* | 2/2018 | Hussain | H01L 29/1606 |

* cited by examiner

METHOD FOR FORMING A SEMICONDUCTOR DEVICE COMPRISING A SELECTIVELY GROWN GRAPHENE LAYER

CROSS-REFERENCE TO RELATED APPLICATION

This application is based on and claims priority to Chinese Patent Application CN201610868166.4, filed Sep. 30, 2016, the entire content of which is incorporated herein by reference.

BACKGROUND

Technical Field

The present disclosure relates to the technical field of semiconductor processing, particularly to a semiconductor device and a manufacturing method therefor, and more particularly to a dual-gate graphene semiconductor device and a manufacturing method therefor.

Related Art

With the constant development of semiconductor technologies, the size of semiconductor devices have become smaller. Semiconductor devices based on silicon materials are the basis of current semiconductor technologies. Devices based on silicon materials will still be the mainstream of the development of semiconductor technologies at least for an indefinitely long period of time in the future. However, to ensure that semiconductor technologies can continue to evolve according to, for example, the Moore's Law, only reducing the device size proportionally cannot meet the requirements. Therefore, new materials need to be developed in the process of reducing the size of semiconductor devices.

An ideal new material may be introduced into the existing CMOS manufacturing process, so as to lower chip manufacturing costs while improving device performance. Because graphene materials feature good thermal conductivity and high carrier mobility, graphene-based semiconductor devices are considered by the industry as one of the candidate solutions that offers improvement over silicon-based semiconductor devices in the future.

Existing methods for patterning graphene mainly include a photolithography method and a direct laser raster writing method. Although the direct laser raster writing method introduces no other reagents in the process of patterning graphene, a patterned features in the graphene layer obtained by using this method may not be fine enough (i.e., may be of insufficient resolution) and may require a long production cycle. The photolithography method, on the other hand, introduces other chemical reagents during etching, and the use of a developing solution and a stripping solution for, e.g., photo resists, will increase the sheet resistance of the patterned graphene.

Therefore, speedy manufacturing of high-quality semiconductor devices having a patterned graphene layer represents one of the major challenges in the development of new semiconductor processes.

SUMMARY

To address at least one of the foregoing problems, the present disclosure proposes the at least the following forms of implementations.

According to an aspect of the present disclosure, a method for manufacturing a semiconductor device is provided. The method includes: providing a substrate containing a first dielectric layer; forming a lower gate material layer on the first dielectric layer; patterning the lower gate material layer to form gate lines; depositing a second dielectric layer on the first dielectric layer and the gate lines to cover the gate lines; planarizing the second dielectric layer to expose upper surfaces of the gate lines; forming an insulating buffer material layer on the second dielectric layer and the gate lines; patterning the insulating buffer material layer to form a patterned insulating buffer layer comprising multiple separate portions, each portion extending to intersect one or more gate lines; selectively growing a graphene layer on the patterned insulating buffer layer; forming a third dielectric layer to cover the graphene layer and the second dielectric layer; and forming an upper gate electrode layer on the third dielectric layer.

According to another aspect of the present disclosure, another method for manufacturing a semiconductor device is provided. The method includes: providing a substrate containing a first dielectric layer; forming a lower gate material layer on the first dielectric layer; patterning the lower gate material layer to form gate lines; depositing a second dielectric layer on the first dielectric layer and the gate lines to cover the gate lines; planarizing the second dielectric layer to expose upper surfaces of the gate lines; forming an insulating buffer material layer on the second dielectric layer and the gate lines; patterning the insulating buffer material layer, so as to form an insulating buffer layer extending to intersect the gate lines; forming a patterned fourth dielectric layer, wherein the patterned fourth dielectric layer covers a portion of the patterned insulating buffer layer and exposes separate portions of the patterned insulating buffer layer, where each exposed portion of the patterned insulating buffer layer intersects one or more gate lines; selectively growing a graphene layer on the exposed portions of the patterned insulating buffer layer; forming a third dielectric layer to cover the graphene layer and the fourth dielectric layer; and forming an upper gate electrode layer on the third dielectric layer.

In form, the lower gate material layer includes a polysilicon layer and a doped silicon germanium layer grown on the polysilicon layer.

In a form, the lower gate material layer includes: a polysilicon layer, and a doped layer of silicides of cobalt or a layer of conductive nitrides of boron which is formed on the polysilicon layer.

In a form, the graphene layer is selectively grown on the insulating buffer layer at a temperature of 900-1000° C. by a chemical vapor deposition process using methane and hydrogen.

In a form, the patterned insulating buffer layer includes an oxide of aluminum.

In a form, the third dielectric layer includes: an oxide of silicon, an oxide of hafnium, a nonconductive nitride of boron, or a nitride of aluminum.

In a form, the methods above further include patterning the upper gate electrode layer to form an upper gate electrode.

According to an aspect of the present disclosure, a semiconductor device is provided, including: a substrate containing a first dielectric layer; a second dielectric layer and gate lines on the first dielectric layer, wherein an upper surface of the second dielectric layer and an upper surface of the gate lines facing away from the substrate flush with one another; a patterned insulating buffer layer on the second dielectric layer and the gate lines, wherein the patterned insulating buffer layer comprises multiple separate portions each extending to intersect one or more gate lines; a graphene layer selectively grown on the patterned insulating buffer layer; a third dielectric layer covering the graphene layer and the second dielectric layer; and an upper gate electrode on the third dielectric layer.

According to another aspect of the present disclosure, another semiconductor device is provided, including: a substrate containing a first dielectric layer; a second dielectric layer and gate lines on the first dielectric layer, wherein an upper surface of the second dielectric layer and an upper surface of the gate lines facing away from the substrate flush with one another; a patterned insulating buffer layer on the second dielectric layer and the gate lines, wherein the insulating buffer layer extends to intersect the gate lines; a fourth dielectric layer covering part of the patterned insulating buffer layer, and separating the patterned insulating buffer layer into separate portions uncovered by the fourth dielectric layer, wherein each separate uncovered portion of the patterned insulating buffer layer intersects one or more gate lines; a graphene layer selectively grown on the separated portions of the patterned insulating buffer layer; a third dielectric layer covering the graphene layer and the fourth dielectric layer; and an upper gate electrode on the third dielectric layer.

In a form, the gate line includes a polysilicon layer and a doped silicon germanium layer on the polysilicon layer.

In a form, the gate line includes a polysilicon layer and a doped layer of silicides of cobalt or a layer of conductive nitrides of boron on the polysilicon layer.

In a form, the patterned insulating buffer layer includes an oxide of aluminum.

In a form, the third dielectric layer includes: an oxide of silicon, an oxide of hafnium, a nonconductive nitride of boron, or a nitride of aluminum.

According to the following detailed descriptions of the forms for illustration purposes of the present disclosure with reference to the accompanying drawings, other characters and advantages of the present disclosure will become clear.

BRIEF DESCRIPTION OF THE DRAWINGS

The accompanying drawings that form a part of the specification describe forms of the present disclosure, and are used to explain the principles of the present disclosure together with the specification.

With reference to the accompanying drawings, the present disclosure can be understood more clearly according to the following detailed description, where.

DETAILED DESCRIPTION

Figure 1:
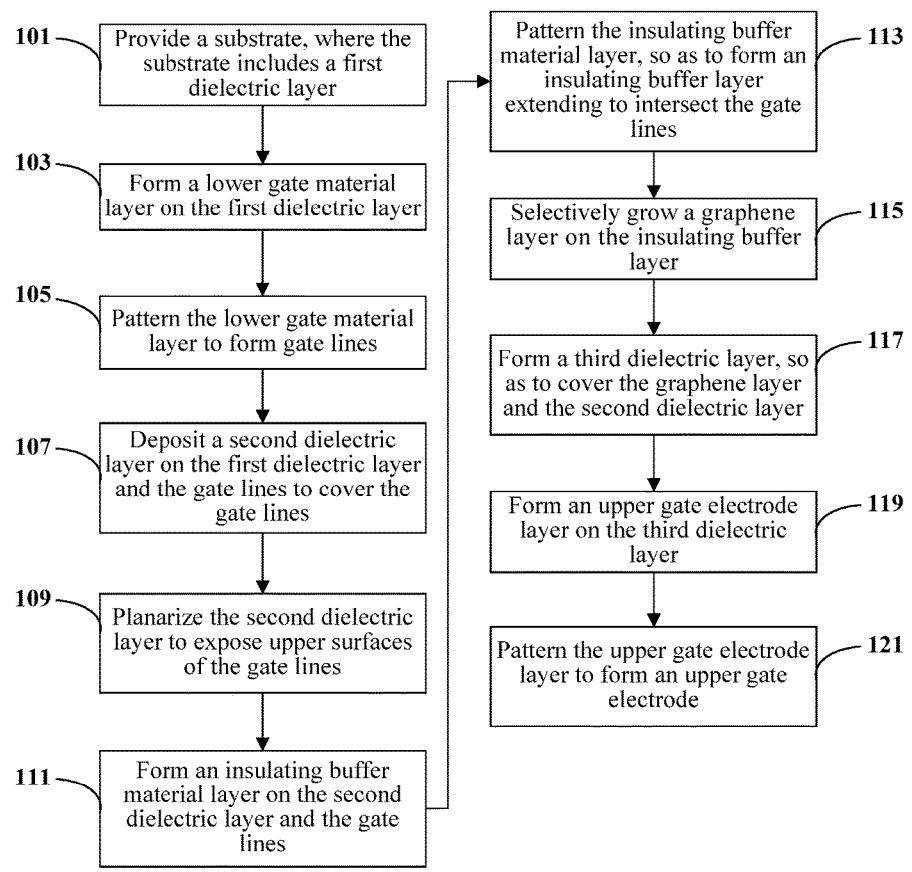
FIG. 1 is a schematic flowchart of a method for manufacturing a semiconductor device.

Various exemplary forms or implementations for illustration purposes of the present disclosure are described in detail with reference to the accompanying drawings. It should be noted that unless being described in detail, relative layouts, mathematical expressions, and numeric values of components and steps described in these forms do not limit the scope of the present disclosure.

In addition, it should be noted that for ease of description, sizes of the parts shown in the accompanying drawings are not drawn according to any actual proportional relationship.

The following description about at least one exemplary form is illustrative only, and would not be used as any limitation on the present disclosure and applications or uses of the present disclosure.

Technologies, methods, and devices that are known by a person of ordinary skill in the related may not be discussed in detail. However, if appropriate, these technologies, methods, and devices should be considered as a part of the description.

In all examples shown and discussed herein, any specific value should be interpreted to be illustrative only rather than a limitation. Therefore, other examples of the forms for illustration purposes may have different values.

It should be noted that similar reference numerals, labels, and letters represent similar items in the following accompanying drawings. Therefore, once an item is defined in a figure, the item may be but needs not to be further discussed in subsequent figures.

FIG. 1 is a schematic flowchart of a method for manufacturing a semiconductor device. FIG. 3A to FIG. 3J illustrate schematically perspective views of several phases of the process of manufacturing a semiconductor device according to FIG. 1. Description is made in the following with reference to FIG. 1 and FIG. 3A to FIG. 3J.

As shown in FIG. 1, in step 101, a substrate is provided.

Figure 3A:
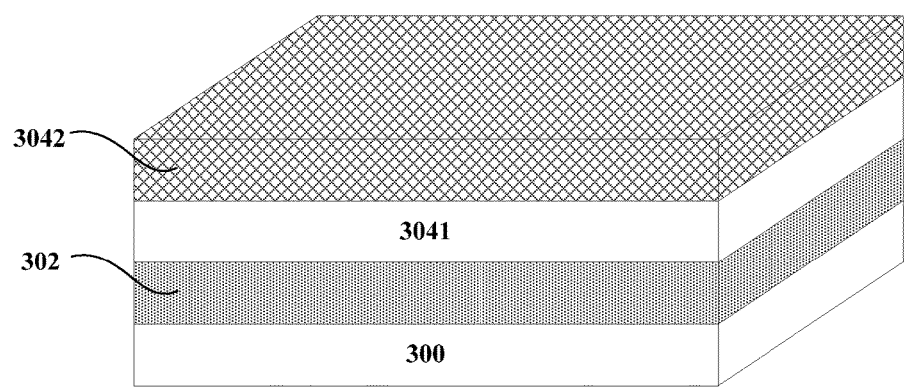
FIG. 3A to FIG. 3J illustrate schematically perspective views of several phases of a process of manufacturing a semiconductor device.

As shown in FIG. 3A, the substrate may include a base layer 300 and a first dielectric layer 302 on the base layer 300. The base layer 300 may be made of, for example, a bulk semiconductor such as bulk silicon. The material of the first dielectric layer 302 may include an oxide of silicon or a nitride of silicon. It should be understood that the substrate of the present disclosure may be formed by using methods, process steps, and materials known in this field. Therefore, details of a process of forming the substrate are not described herein.

Referring to FIG. 1, in step 103, a lower gate material layer on the first dielectric layer is formed.

In an implementation, the lower gate material layer may include a polysilicon layer 3041 (which may be doped) as shown in FIG. 3A, and optionally, may further include an additional conductive layer 3042 formed on the polysilicon layer 3041. The material for the additional conductive layer 3042 may include, for example, doped silicon germanium, a doped silicide of cobalt, or a conductive nitride of boron. In some of these implementations, the polysilicon layer 3041 may be used to enhance adhesion of the conductive layer 3042 to the first dielectric layer 302, or may facilitate formation of the conductive layer 3042.

Subsequently, as shown in FIG. 1, in step 105, the lower gate material layer is patterned.

Figure 3B:
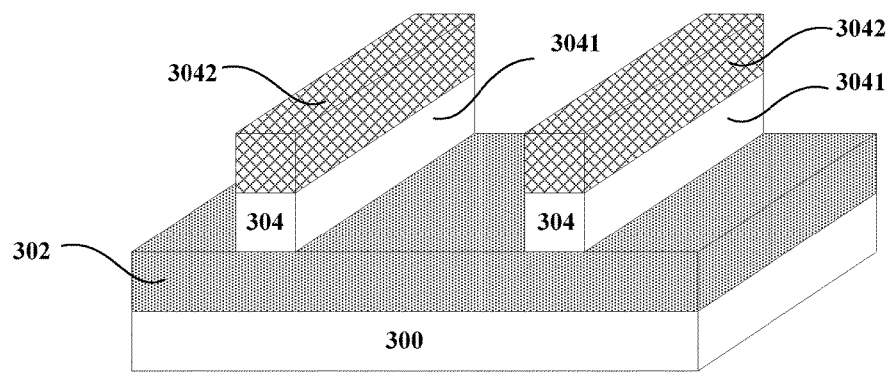

In an implementation, the lower gate material layer may be patterned by using methods and process steps known in this field, such as dry etching or wet etching, so as to form gate lines 304 shown in FIG. 3B. In a form as shown in FIG. 3B, the gate line 304 may include a polysilicon layer 3041 and a conductive layer 3042.

Subsequently, as shown in FIG. 1, in step 107, a second dielectric layer on the first dielectric layer and the gate lines is deposited to cover the gate lines.

Figure 3C:
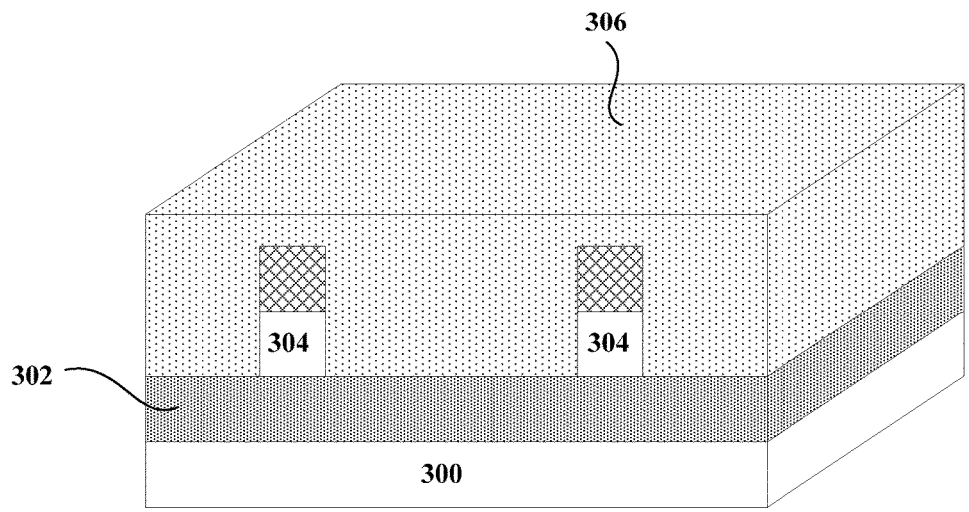

In an implementation, a second dielectric layer 306 is deposited on the first dielectric layer 302 and the gate lines 304 to cover the gate lines 304, as shown in FIG. 3C. The material of the second dielectric layer 306 may include an oxide of silicon or a nitride of silicon.

Referring to FIG. 1, in step 109 the second dielectric layer is planarized to expose upper surfaces of the gate lines.

Figure 3D:
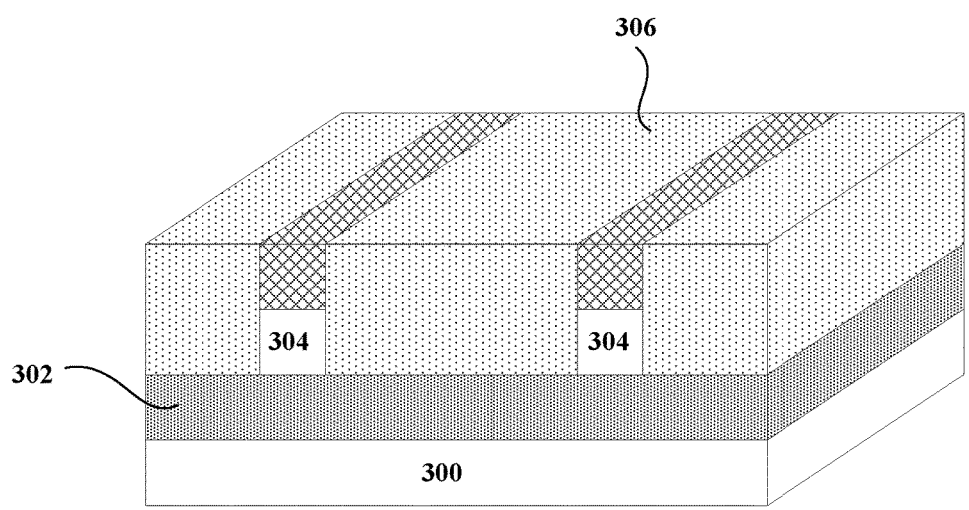

In an implementation, for example, the second dielectric layer 306 may be planarized by using a chemical-mechanical planarization (CMP) process, so as to expose upper surfaces of the gate lines 304, as shown in FIG. 3D.

Subsequently, as shown in FIG. 1, in step 111, an insulating buffer material layer on the second dielectric layer and the gate lines is formed.

Figure 3E:
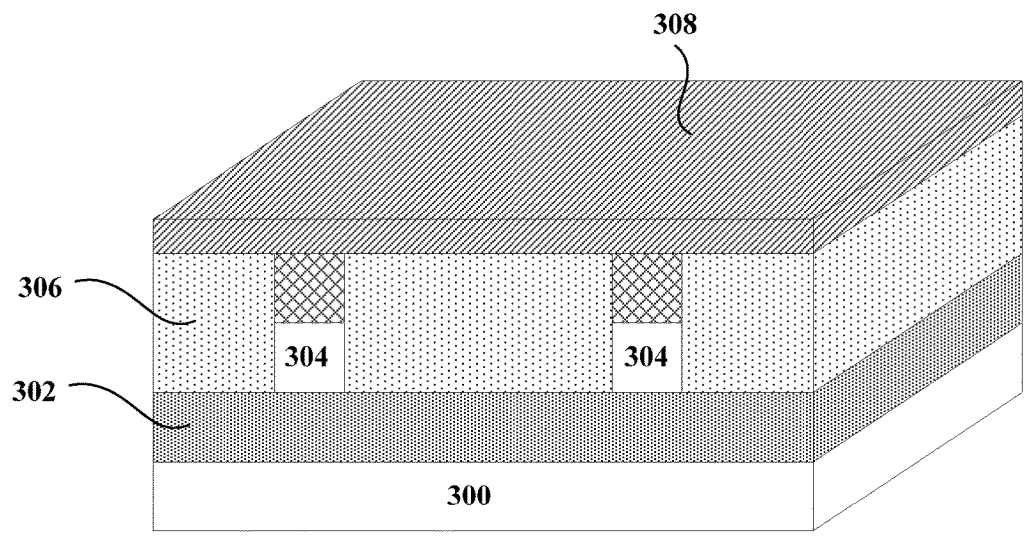

In an implementation, an insulating buffer material layer 308 may be formed on the second dielectric layer 306 and the gate lines 304 as shown in FIG. 3E, by using process steps such as chemical vapor deposition. The material of the insulating buffer material layer 308 may be suitable for selectively growing a graphene layer, and may include, for example, an oxide of aluminum.

Subsequently, as shown in FIG. 1, in step 113, the insulating buffer material layer is patterned.

Figure 3F:
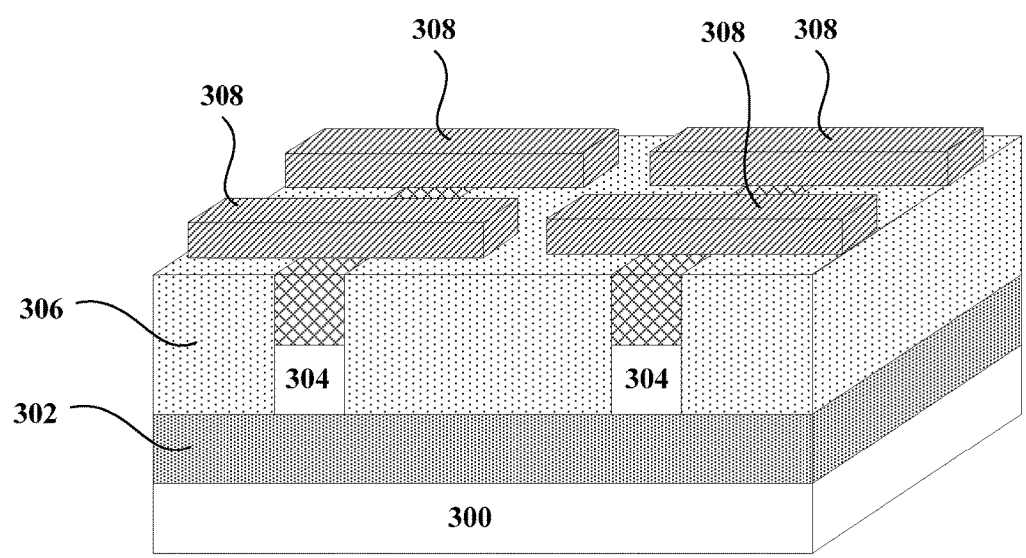

In an implementation, the insulating buffer material layer 308 is patterned, so as to form a patterned insulating buffer layer 308 extending to intersect the gate lines 304, as shown in FIG. 3F. The patterned insulating buffer layer 308 may include a plurality of separate portions. Each separate portion corresponds to one or more gate lines 304; and extends to intersect the corresponding gate lines 304. For example, the insulating buffer material layer may be patterned by using a nitride of silicon as a hard mask and using a Self-Aligned Double Patterning (Self-Aligned Double Patterning, SADP for short) process, so as to form the patterned insulating buffer layer 308 which extends to intersect the gate lines 304. In one implementation, the patterned buffer layer 308 may contain multiple separate portions where each separate portion intersects with one of the gate lines 304. Then, the remaining portions of the hard mask is removed. In this way, a device structure shown in FIG. 3F is obtained.

Referring to FIG. 1, in step 115, a graphene layer on the insulating buffer layer is selectively grown.

Figure 3G:
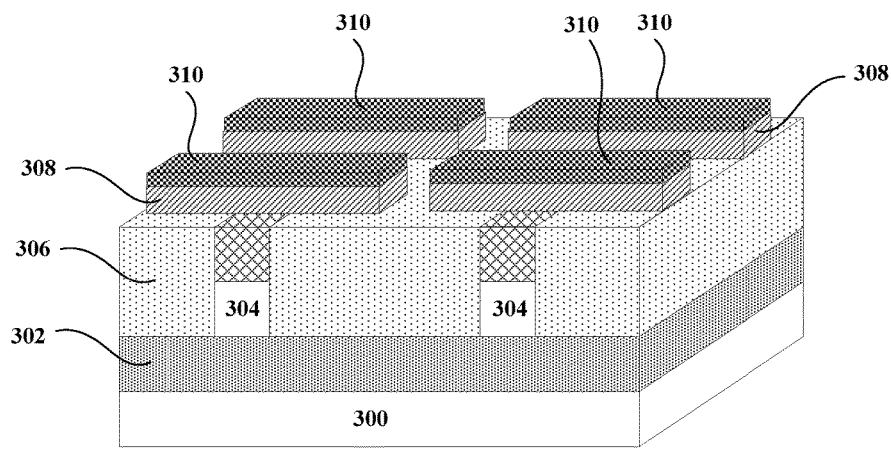

In an implementation, a graphene layer 310 may be selectively grown (in-situ) on the insulating buffer layer 308, as shown in FIG. 3G, in a temperature environment of 900-1000° C. by a chemical vapor deposition process using methane and hydrogen. The graphene layer 310 may alternatively be selectively grown (in-situ) on the insulating buffer layer 308 by using other growth techniques, forming the structure as shown in FIG. 3G.

Subsequently, as shown in FIG. 1, in step 117, a third dielectric layer is formed so as to cover the graphene layer and the second dielectric layer.

Figure 3H:
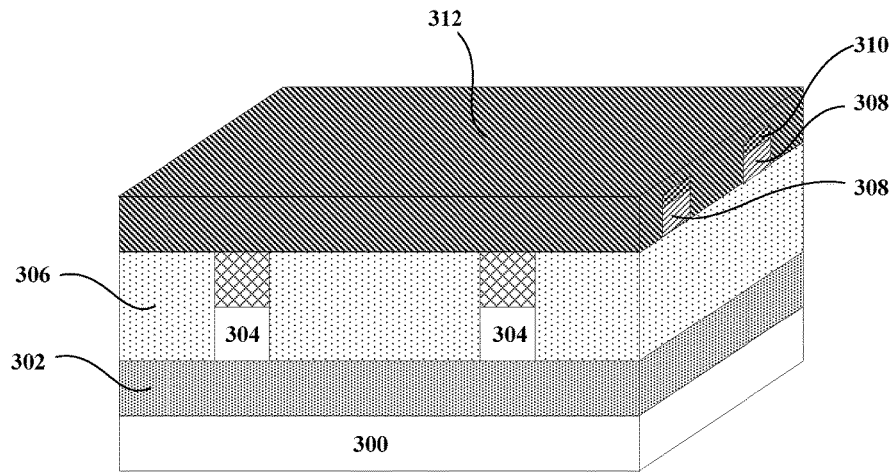

In an implementation, as shown in FIG. 3H, a third dielectric layer 312 may be formed by using, for example, a physical vapor deposition process, and then a chemical-mechanical planarization process. The third dielectric layer 312 covers the graphene layer 310 and the second dielectric layer 306. The material of the third dielectric layer 312 may include, for example: an oxide of silicon, an oxide of hafnium, a nonconductive nitride of boron, or a nitride of aluminum.

Subsequently, as shown in FIG. 1, in step 119, an upper electrode layer on the third dielectric layer is formed.

Figure 3I:
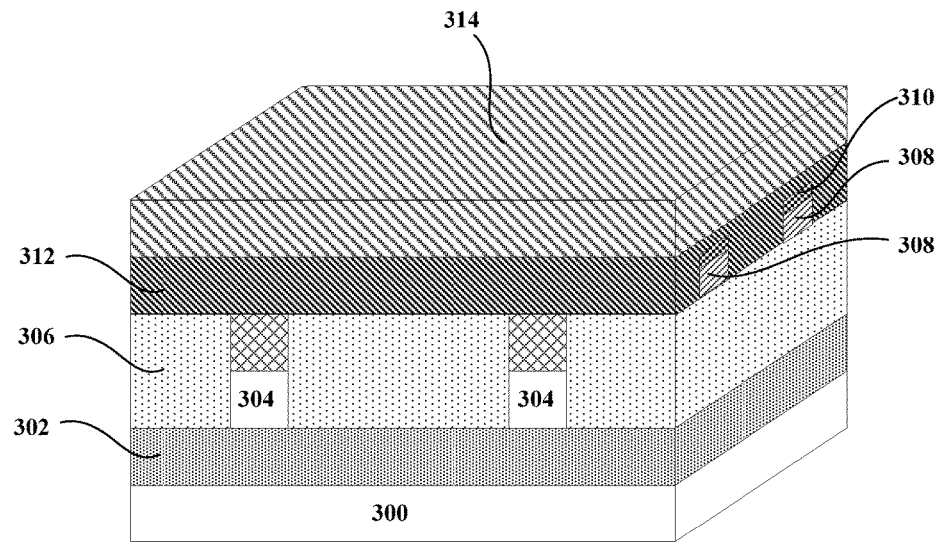

In an implementation, as shown in FIG. 3I, an upper gate electrode layer 314 is formed on the third dielectric layer 312, where the material of the upper gate electrode layer 314 may include materials such as polysilicon, a metal, and/or a silicide of the metal that are suitable for serving as a gate material.

Figure 3J:
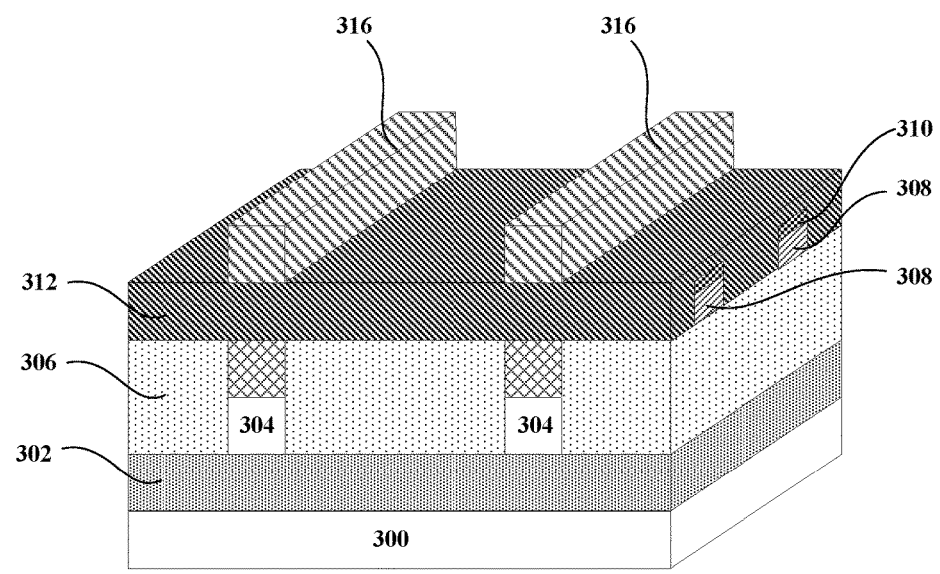

Optionally, as shown in FIG. 1, after step 119, the method may further include step 121 for patterning the upper gate electrode layer 314 to form one or more upper gate electrodes, such as the dual gates 316 shown in FIG. 3J.

The method for manufacturing a semiconductor device in this form above provides using a selective growth of graphene to avoid undesired effects associated with patterning graphene by using other processes such as direct laser raster writing and etching or photoetching. In addition, the semiconductor device according to the present disclosure may contain a dual-gate structure shown in FIG. 3J and may offer better current control.

Figure 2:
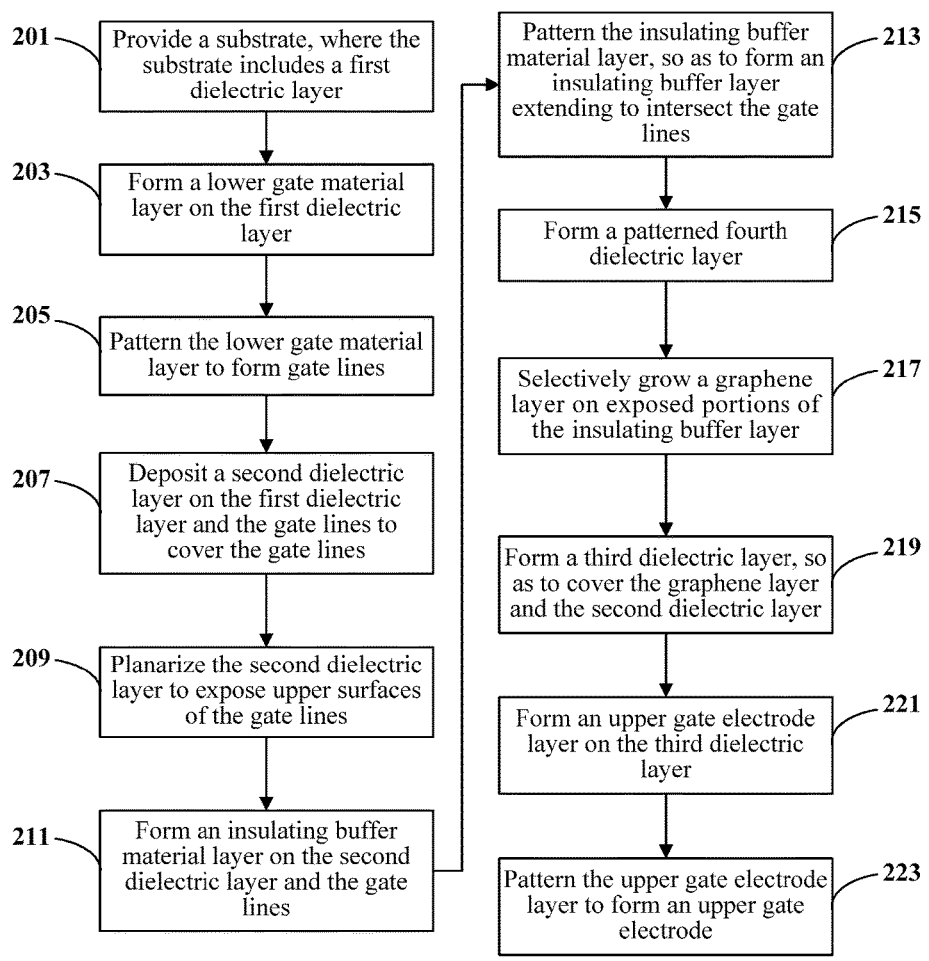
FIG. 2 is schematic flowchart of another method for manufacturing a semiconductor device.

FIG. 2 is a schematic flowchart of another method for manufacturing a semiconductor device. FIG. 4A to FIG. 4G illustrate schematically perspective views of several phases of a process of manufacturing a semiconductor device according to FIG. 2. Description is made in the following with reference to FIG. 2 and FIG. 4A to FIG. 4G.

As shown in FIG. 2, step 201 to step 211 are same or similar to step 101 to step 111 shown in FIG. 1. Therefore, step 201 to step 211 are not described herein in detail.

In step 213, an insulating buffer material layer is patterned.

Figure 4A:
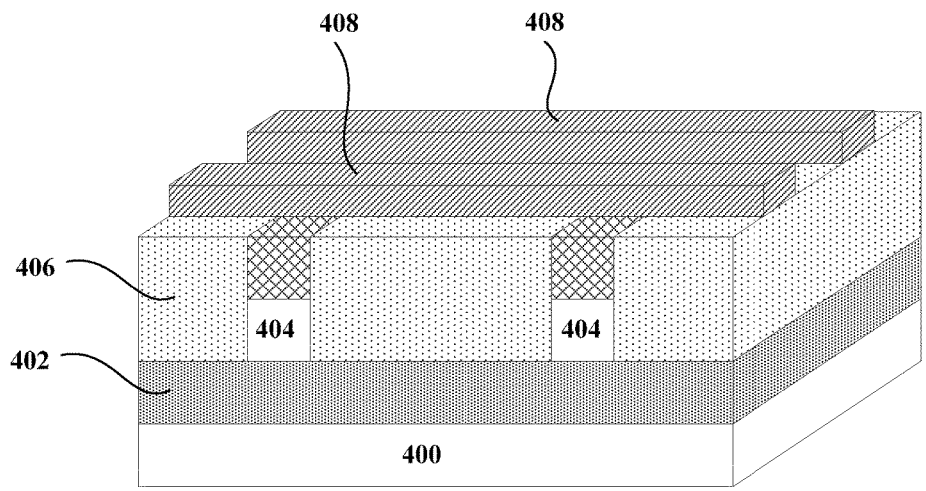
FIG. 4A to FIG. 4G illustrate schematically perspective views of several phases of another process of manufacturing a semiconductor device.

One implementation is shown in FIG. 4A by a perspective view of a device obtained after steps 201-213. A first dielectric layer 402 is formed on a base layer 400. The base layer 400 may be made of, for example, a bulk semiconductor such as bulk silicon. The material of the first dielectric layer 402 may include an oxide of silicon or a nitride of silicon. A second dielectric layer 406 covers the first dielectric layer 402, and the top of the second dielectric layer 406 is approximately level with the upper surface of the gate lines 404, so that upper surfaces of the gate lines 404 is not covered by the second dielectric layer 406. A patterned insulating buffer layer 408 is formed on the gate line 404, and the patterned insulating buffer layer 408 extends to intersect the gate lines 404. The patterned insulating buffer layer 408 may include a plurality of separate portions (such as the lines 408 shown in FIG. 4A). Each separate portion may intersect multiple gate lines 404. The material of the patterned insulating buffer layer 408 may be suitable for selectively growing a graphene layer, and includes, for example, an oxide of aluminum.

Referring to FIG. 2, in step 215, a patterned fourth dielectric layer is formed.

Figure 4B:
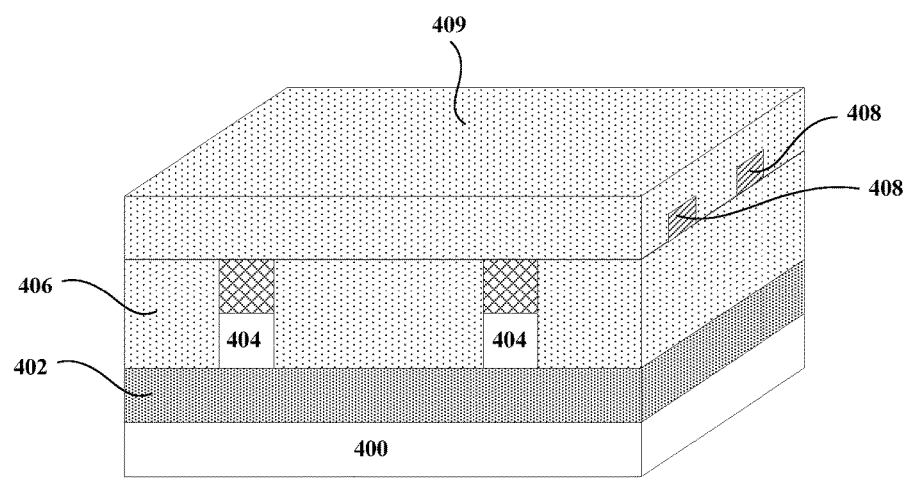
Figure 4C:
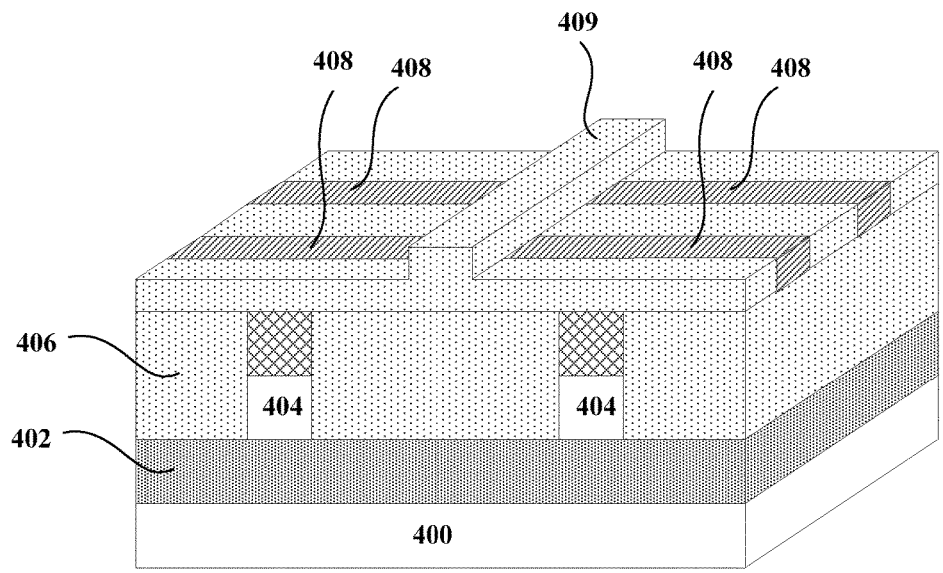

In an implementation, as shown in FIG. 4B, a fourth dielectric layer 409 may be deposited by using process steps such as chemical vapor deposition, so as to cover the insulating buffer layer 408. The material of the fourth dielectric layer 409 may include an oxide of silicon or a nitride of silicon. Following the deposition of the fourth dielectric layer 409 and by using a patterned mask, dry etching is performed to the fourth dielectric layer 409, and residuals are removed by a wet etching process. As a result, a patterned fourth dielectric layer 409 is formed. The patterned fourth dielectric layer 409 covers part of the separate portions of the patterned insulating buffer layer 408, and the rest of the patterned insulating buffer layer 408 is exposed and is not covered by the patterned fourth dielectric layer 409. The uncovered or exposed part of the patterned insulating buffer layer 408 intersects one or more gate lines 404, as shown in FIG. 4C.

Subsequently, as shown in FIG. 2, in step 217, a graphene layer is selectively grown on the part of the patterned insulating buffer layer uncovered by the patterned fourth insulating layer 409.

Figure 4D:
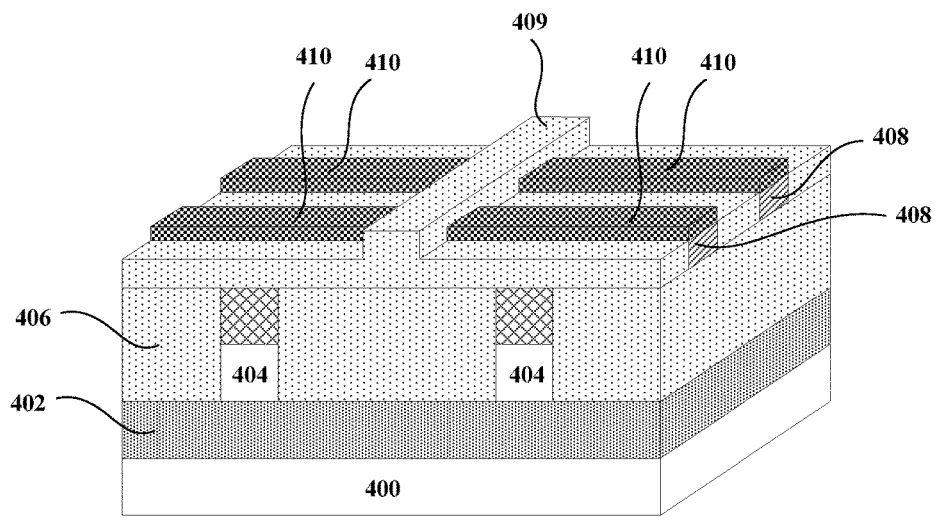

In an implementation, as shown in FIG. 4D, a graphene layer 410 may be selectively grown (in-situ) on the exposed parts of the patterned insulating buffer layer 408 in at a temperature of 900-1000° C. by a chemical vapor deposition process using methane and hydrogen. The graphene layer 410 may alternatively be selectively grown (in-situ) on the insulating buffer layer 408 using other technical modes.

Subsequently, referring to FIG. 2, in step 219, a third dielectric layer is formed.

Figure 4E:
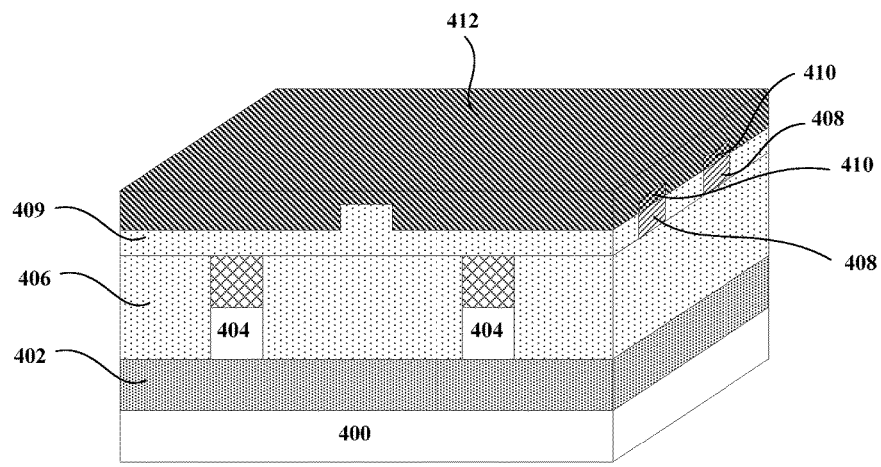

In an implementation, as shown in FIG. 4E, a third dielectric layer 412 may be formed by using a physical vapor deposition process, followed by a chemical-mechanical planarization. The third dielectric layer 412 covers the graphene layer 410 and the fourth dielectric layer 409. The material for the third dielectric layer 412 may include, for example, an oxide of silicon, an oxide of hafnium, a nonconductive nitride of boron, or a nitride of aluminum.

Subsequently, as shown in FIG. 2, in step 221, an upper gate electrode layer is formed on the third dielectric layer.

Figure 4F:
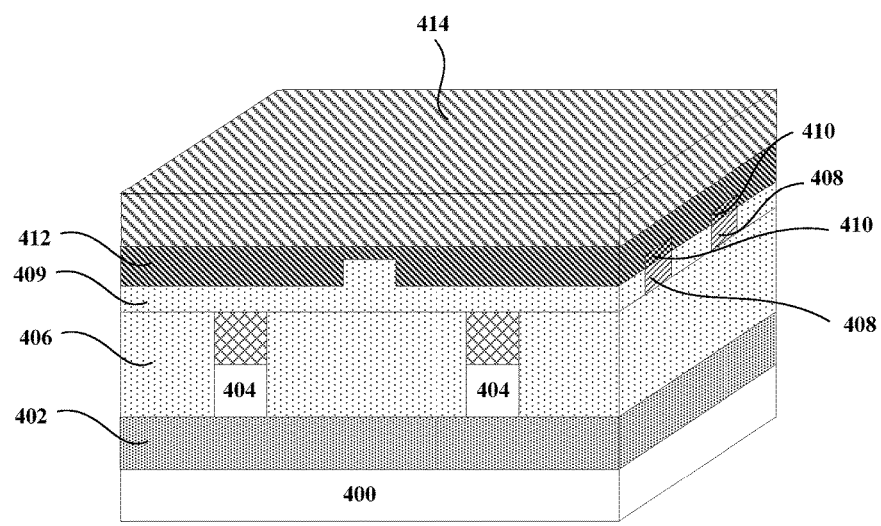

In an implementation, as shown in FIG. 4F, an upper gate electrode layer 414 is formed on the third dielectric layer 412, where the material of the upper gate electrode layer 414 may include materials such as polysilicon, a metal, or a silicide of the metal that are suitable for serving as a gate material.

Figure 4G:
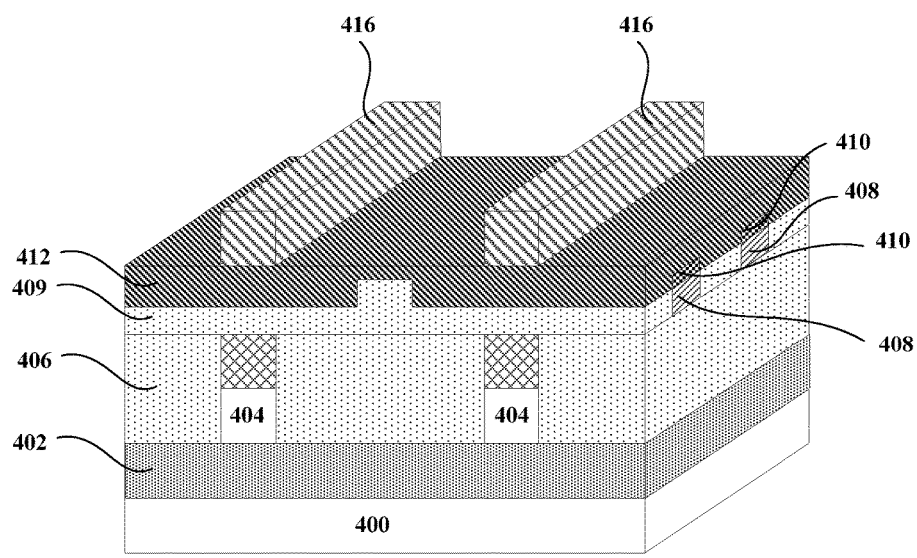

Optionally, as shown in FIG. 2, after step 221, the method may further include step 223, in which the upper gate electrode layer 414 is patterned to form an upper gate electrode 416, as shown in FIG. 4G. It should be understood that the upper gate electrode layer 414 may be patterned by using methods, process steps, and materials known in this field, so as to form the upper gate electrode 416. Therefore, these methods and processes, and materials are not described herein in detail.

The method for manufacturing a semiconductor device in the form above (FIGS. 2 and 4) may reduce complexity of the process steps of patterning the insulating buffer material layer for selective growth of graphene. Specifically, the separation of portions of the graphene layers may be achieved by covering portions of the insulating buffer layer using the fourth dielectric layer rather than by etching the insulating buffer layer. Furthermore, the selectively grown graphene further help avoid undesired effects associated with patterning graphene using other processes such as direct laser writing or photoetching. In addition, the semiconductor device according to the present disclosure includes a dual-gate structure as shown in FIG. 4G that offers better current control.

It should be understood that this disclosure further teaches a semiconductor device, including: a substrate containing a first dielectric layer; a second dielectric layer and gate lines on the first dielectric layer, where an upper surface of the second dielectric layer flushes with the gate lines. The semiconductor device further contains a patterned insulating buffer layer on the second dielectric layer and the gate lines. The insulating buffer layer contains multiple separate portions each extending to intersect one or more gate lines. The semiconductor device further contains a graphene layer selectively grown on the patterned insulating buffer layer, a third dielectric layer covering the graphene layer and the second dielectric layer, and an upper gate electrode on the third dielectric layer.

In an implementation, the gate line includes a polysilicon layer and a doped silicon germanium layer on the polysilicon layer.

In an implementation, the gate line includes a polysilicon layer and a doped layer of silicides of cobalt or a layer of conductive nitrides of boron on the polysilicon layer.

In an implementation, the material of the insulating buffer layer includes an oxide of aluminum.

In an implementation, the material of the third dielectric layer includes: an oxide of silicon, an oxide of hafnium, a nonconductive nitride of boron, or a nitride of aluminum.

This disclosure further teaches another semiconductor device, including: a substrate including a first dielectric layer; a second dielectric layer and gate lines on the first dielectric layer, where an upper surface of the second dielectric layer flushes with the gate lines. The semiconductor device further contains a patterned buffer layer on the second dielectric layer and the gate lines where the patterned insulating buffer layer extends to intersect the gate lines. The semiconductor device further contains a fourth dielectric layer, part of which covers a portion of the patterned insulating buffer layer and part of which flushes with the rest of the patterned insulating buffer layer, leading to formation of separate portions in the patterned insulating buffer layer (for selective growth of graphene layer of separate portions) where each separated portion intersects one or more gate lines. The semiconductor device further contains a graphene layer selectively grown on portions of the patterned insulating buffer layer that are not covered by the fourth dielectric layer, a third dielectric layer covering the graphene layer and the fourth dielectric layer, and an upper gate electrode on the third dielectric layer.

In an implementation, the gate line above includes a polysilicon layer and a doped silicon germanium layer on the polysilicon layer.

In an alternative implementation, the gate line above includes a polysilicon layer and a doped layer of silicides of cobalt or a layer of conductive nitrides of boron on the polysilicon layer.

In an implementation, the material of the insulating buffer layer above includes an oxide of aluminum.

In an implementation, the material of the third dielectric layer above includes: an oxide of silicon, an oxide of hafnium, a nonconductive nitride of boron, or a nitride of aluminum.

Heretofore, a semiconductor device and a manufacturing method therefor according to the non-limiting forms of this disclosure are described in detail. To avoid obscuring the teaching of this disclosure, some details generally known in this field are not described; and according to the description above, a person of ordinary skill in the art would understand how to implement a technical solution disclosed herein. In addition, this specification discloses that the forms taught may be combined freely. A person of ordinary skill in the art should understand that various variations may be made to the forms described above without departing from the spirit and scope of this disclosure.

What is claimed is:

1. A method for manufacturing a semiconductor device, comprising:
   providing a substrate comprising a first dielectric layer;
   forming a lower gate material layer on the first dielectric layer;
   patterning the lower gate material layer to form gate lines;
   depositing a second dielectric layer on the first dielectric layer and the gate lines to cover the gate lines;
   planarizing the second dielectric layer to expose upper surfaces of the gate lines;
   forming an insulating buffer material layer on the second dielectric layer and the gate lines;
   patterning the insulating buffer material layer to form a patterned insulating buffer layer comprising multiple separate portions, each portion extending to intersect one or more gate lines;

selectively growing a graphene layer on the patterned insulating buffer layer;

forming a third dielectric layer to cover the graphene layer and the second dielectric layer; and forming an upper gate electrode layer on the third dielectric layer.

2. The method according to claim 1, wherein the lower gate material layer comprises a polysilicon layer and a doped silicon germanium layer grown on the polysilicon layer.

3. The method according to claim 1, wherein the lower gate material layer comprises a polysilicon layer, and a doped layer of silicides of cobalt or a layer of conductive nitrides of boron formed on the polysilicon layer.

4. The method according to claim 1, wherein the graphene layer is selectively grown on the patterned insulating buffer layer at a temperature of 900-1000° C. by a chemical vapor deposition process using methane and hydrogen.

5. The method according to claim 1, wherein the insulating buffer material layer comprises an oxide of aluminum.

6. The method according to claim 1, wherein the third dielectric layer comprises an oxide of silicon, an oxide of hafnium, a nonconductive nitride of boron, or a nitride of aluminum.

7. The method according to claim 1, further comprising patterning the upper gate electrode layer to form an upper gate electrode.

8. A method for manufacturing a semiconductor device, comprising:

providing a substrate comprising a first dielectric layer;

forming a lower gate material layer on the first dielectric layer;

patterning the lower gate material layer to form gate lines;

depositing a second dielectric layer on the first dielectric layer and the gate lines to cover the gate lines;

planarizing the second dielectric layer to expose upper surfaces of the gate lines;

forming an insulating buffer material layer on the second dielectric layer and the gate lines;

patterning the insulating buffer material layer to form a patterned insulating buffer layer extending to intersect the gate lines;

forming a patterned fourth dielectric layer, wherein the patterned fourth dielectric layer covers a portion of the patterned insulating buffer layer and exposes separate portions of the patterned insulating buffer layer, where each exposed portion of the patterned insulating buffer layer intersects one or more gate lines;

selectively growing a graphene layer on the exposed portions of the patterned insulating buffer layer;

forming a third dielectric layer to cover the graphene layer and the fourth dielectric layer; and forming an upper gate electrode layer on the third dielectric layer.

9. The method according to claim 8, wherein the lower gate material layer comprises a polysilicon layer and a doped silicon germanium layer grown on the polysilicon layer, or a polysilicon layer, and a doped layer of silicides of cobalt or a layer of conductive nitrides of boron formed on the polysilicon layer.

10. The method according to claim 8, wherein the graphene layer is selectively grown on the patterned insulating buffer layer at a temperature of 900-1000° C. by a chemical vapor deposition process using methane and hydrogen.

11. The method according to claim 8, wherein the insulating buffer material layer comprises an oxide of aluminum and the third dielectric layer comprises an oxide of silicon, an oxide of hafnium, a nonconductive nitride of boron, or a nitride of aluminum.

12. The method according to claim 8, further comprising patterning the upper gate electrode layer to form an upper gate electrode.

* * * * *